United States Patent [19]
Yamamoto et al.

[11] Patent Number: 5,959,890
[45] Date of Patent: Sep. 28, 1999

[54] NON-VOLATILE SEMICONDUCTOR MEMORY DEVICE

[75] Inventors: Yasuhiro Yamamoto; Yoshikazu Miyawaki; Masaaki Mihara, all of Tokyo, Japan

[73] Assignee: Mitsubishi Denki Kabushiki Kaisha, Tokyo, Japan

[21] Appl. No.: 09/027,194

[22] Filed: Feb. 20, 1998

[30]     Foreign Application Priority Data

Aug. 8, 1997   [JP]   Japan .................................... 9-214807

[51] Int. Cl.⁶ .................................................. G11C 16/06
[52] U.S. Cl. ............................... 365/185.23; 365/185.18; 365/185.33
[58] Field of Search ......................... 365/185.23, 185.33, 365/185.18, 185.11, 185.29

[56]             References Cited

U.S. PATENT DOCUMENTS

| | | | |
|---|---|---|---|
| 5,602,779 | 2/1997 | Gotou .................................. | 365/185.23 |
| 5,604,711 | 2/1997 | Chueng .............................. | 365/230.06 |
| 5,636,160 | 6/1997 | Omino et al. ...................... | 365/185.02 |
| 5,654,920 | 8/1997 | Watsuji et al. ..................... | 365/185.27 |
| 5,654,925 | 8/1997 | Koh et al. ................................ | 365/201 |
| 5,708,606 | 1/1998 | Tanzawa et al. ................... | 365/185.17 |

FOREIGN PATENT DOCUMENTS 6-162787   6/1994   Japan .
7-169286   7/1995   Japan .

*Primary Examiner*—David Nelms
*Assistant Examiner*—Hien Nguyen
*Attorney, Agent, or Firm*—McDermott, Will & Emery

[57]                ABSTRACT

A non-volatile semiconductor memory device comprises a bit line 402, a plurality of word lines 401 arranged to cross the bit line 402, a plurality of non-volatile memory cells 404 which are disposed at the crossing points of the bit line 402 and the word lines 401 and which have a drain 404*a* connected to the bit line 402 and a control gate 404*f* connected to the corresponding word line 401, and a word line potential applying means 300, 500 wherein in an ordinary reading mode, a selective potential is applied to a word line 401 selected from the plurality of word lines, while a non-selective potential, which is lower than the selective potential, is applied to unselected word lines 401 in response to an address signal, and in a prescribed mode, the selective potential is applied to a word line 401 selected from the plurality of word lines, while a prescribed potential, which is lower than the non-selective potential, is applied to the unselected word lines in response to an address signal.

7 Claims, 12 Drawing Sheets

ERASE OPERATION

PROGRAM OPERATION

READ OPERATION

SPECIFIC TEST MODE OPERATION

NON-VOLATILE SEMICONDUCTOR MEMORY DEVICE

BACKGROUND OF THE INVENTION

1. Field Of The Invention

The present invention relates to a non-volatile semiconductor device, in particular, a flash memory.

2. Discussion Of Background

As a conventional non-volatile semiconductor memory device, there is a flash memory disclosed in, for example, Japanese Unexamined Patent Publication JP-A-6244386.

SUMMARY OF THE INVENTION

It is an object of the present invention to provide a non-volatile semiconductor device capable of conducting the evaluation of a memory cell connected to a bit line to which another memory cell wherein its threshold potential is lower than the level of a non-selective potential of a word line, is connected.

Further, it is an object of the present invention to provide a non-volatile semiconductor memory device wherein a shortcircuit current in a circuit for selecting the word line is controlled.

According to the present invention, there is provided a non-volatile semiconductor memory device which comprises:

a bit line, a plurality of word lines arranged to cross the bit line, a plurality of non-volatile memory cells which are disposed at the crossing points of the bit line and the word lines and which have a drain connected to the bit line and a control gate connected to the corresponding word line, and a word line potential applying means wherein in an ordinary reading mode, a selective potential is applied to a word line selected from the plurality of word lines, while a non-selective potential, which is lower than the selective potential, is applied to unselected word lines in response to an address signal, and in a prescribed mode, the selective potential is applied to a word line selected from the plurality of word lines, while a prescribed potential, which is lower than the non-selective potential, is applied to the unselected word lines in response to an address signal.

In the present invention, the word line potential applying means comprises:

the first potential line for supplying the selective potential, the second potential line for supplying the non-selective potential and the prescribed potential, a row selection circuit which is connected to the first and second potential lines so that the potential of the first potential line is applied to the word line selected from the plurality of word lines, while a potential of the second potential line is applied to the non-selection word lines in response to the address signal, and a low level potential applying circuit wherein in the ordinary reading mode, the non-selective potential is applied to the second potential line, and in the prescribed mode, the prescribed potential is applied to the second potential line.

Further, in the present invention, the low level potential applying circuit includes a pad connected to the second potential line, which is applied with the prescribed potential from the outside in the prescribed mode.

Further, in the present invention, the low level potential applying circuit includes a low level switching circuit which is so adapted that when the prescribed potential is applied to the pad, the pad is electrically connected to the second potential line, and when the ordinary reading mode is carried out, the non-selective potential is applied to the second potential line, and wherein the pad is connected to the second potential line by interposing the low level potential applying circuit.

Further, in the present invention, the low level switching circuit includes:

the first N channel MOS transistor connected between the pad and the second potential line wherein the gate is connected to a non-selective potential node for supplying the non-selective potential, the second N channel MOS transistor connected between the non-selective potential node and the second potential line wherein the gate is connected to the pad, and a charging circuit for charging the gate of the second N channel MOS transistor.

Further, in the present invention, the row selection circuit includes:

decoders each decoding the address signal to output a decode signal having an amplitude between the selective potential and the non-selective potential, drive signal generating circuits provided corresponding respectively to the word lines, each of which receives a high level potential and is connected to the second potential line and which outputs a drive signal having an amplitude between the high level potential and the potential of the second potential line in response to the decode signal, and a plurality of word line drivers each having a gate circuit comprising a P channel type drive transistor which is connected between the first potential line and the word line corresponding thereto and which is turned on when the drive signal have the potential of the second potential line, and an N channel type drive transistor which is connected between the second potential line and the word line corresponding thereto and which is turned on when the drive signal have the high level potential.

Further, in the present invention, the row selection circuit includes:

a negative potential generating circuit for generating a negative potential which is lower than the prescribed potential, decoders each decoding the address signal to output a decode signal having an amplitude between the selective potential and the non-selective potential, drive signal generating circuits provided corresponding respectively to the word lines, each of which receives a high level potential and a negative potential to output a drive signal having an amplitude between the high level potential and the negative potential in response to the decode signal, and a plurality of word line drivers each having a gate circuit comprising a P channel type drive transistor which is connected between the first potential line and the word line corresponding thereto and which is turned on when the drive signal have the negative potential, and an N channel type drive transistor which is connected between the second potential line and the word line corresponding thereto and which is turned on when the drive signal have the high level potential.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
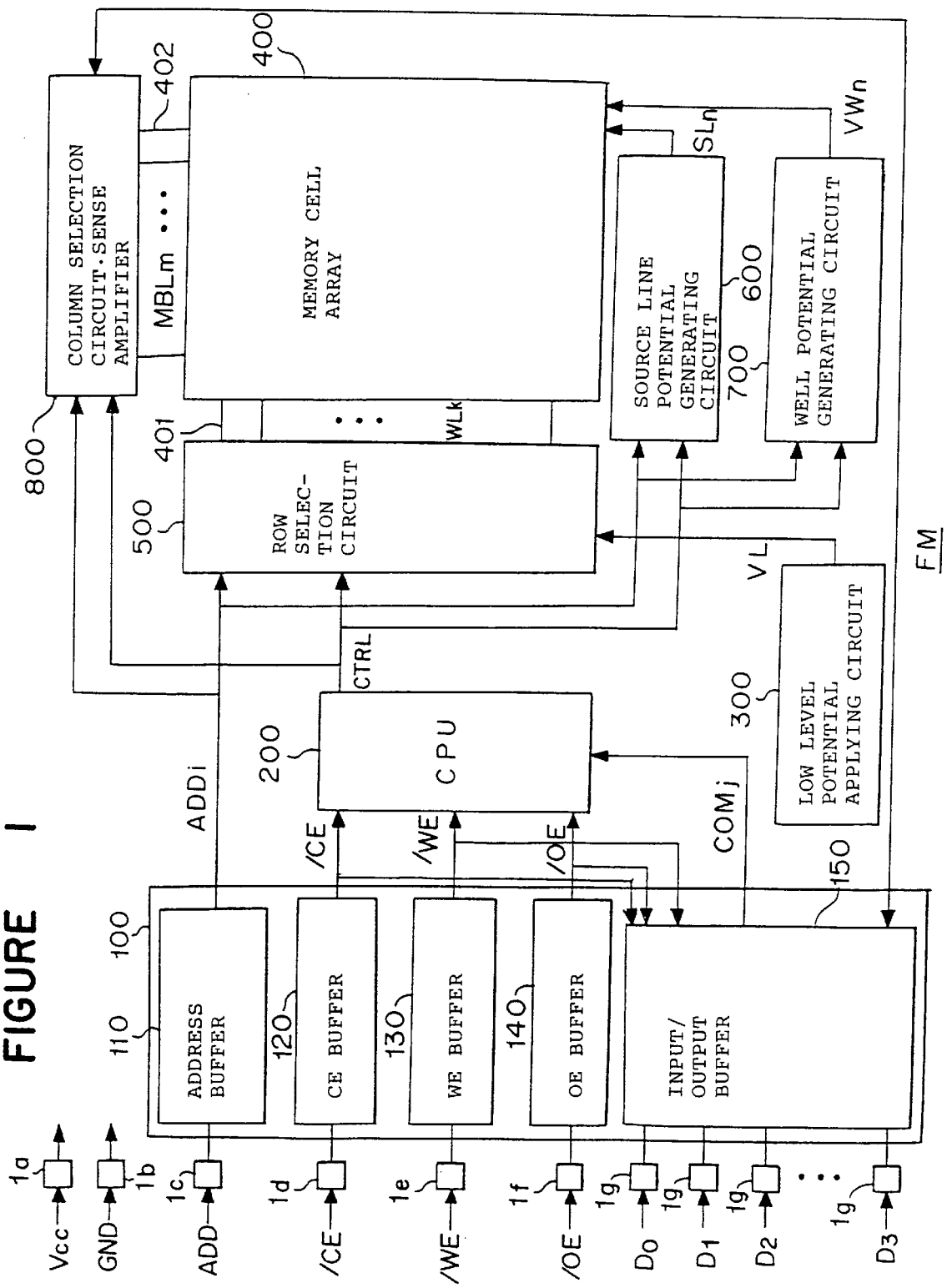
FIG. 1 is a block diagram showing the flash memory according to Embodiment 1 of the present invention.

Preferred embodiments of the present invention will be described with reference to the drawings wherein the same reference numerals designate the same or corresponding parts throughout several figures.

Embodiment 1

A DINOR (Divided NOR) type flash memory as an embodiment of the present invention will be described with reference to FIGS. 1 through 16.

In FIG. 1, a flash memory FM is provided with a power source pad $1a$ to which a power source potential $V_{cc}$ from the outside and an earth pad $1b$ to which a ground potential GND is applied. The flash memory FM is of a single power source type which is operable by receiving the power source potential $V_{cc}$ and the ground potential GND. In Embodiment 1, the power source potential $V_{cc}$ and the ground potential GND are respectively 3.3 V and 0 V. The flash memory FM is further provided with an address pad $1c$ for receiving an address signal ADD from the outside. The address signal may be of plural bits. Accordingly, the address signal ADD and the address pad $1c$ indicate generically a plurality of address signals and address pads.

Further, the flash memory FM has pads $1d$ and $1e$ which respectively receive a chip-enabling signal/CE and a write-enabling signal/WE from the outside. The chip-enabling signal/CE is a signal to render the flash memory FM to be an enabling state wherein when it is in a high level, the flash memory FM is in a disenabling state and when it is in a low level, the flash memory is in an enabling state. The write-enabling signal/WE is a signal indicating that the flash memory FM is in a program mode, an erase mode or a test mode wherein a low level in the write-enabling signal indicates the program mode, the erase mode or the test mode.

Further, the flash memory FM has a pad if for receiving an output-enabling signal/OE from the outside. The output-enabling signal/OE is a signal for instructing a reading mode to the flash memory FM wherein a low level in the signal indicates that an instruction of the reading mode is given. The flash memory FM is provided with a plurality of data pads $1g$ for inputting or outputting 8 bit data $D_{0-D7}$ between the flash memory FM and the outside.

Further, the flash memory FM has a buffer circuit 100. The buffer circuit 100 includes an address buffer 110 which receives the address signal ADD inputted from the outside to the pad $1c$ and outputs an address signal $ADD_i$ in response to the address signal, the address signal $ADD_i$ being for inside circuits. The buffer circuit 100 includes a CE buffer 120, a WE buffer 130 and an OE buffer 140 which respectively receive the chip-enabling signal/CE, the write-enabling signal/WE and the output-enabling signal/OE to be inputted from the outside to the pads $1c$, $1d$ and $1e$, and respectively output a chip-enabling signal/CE, a write-enabling signal/WE and an output-enabling signal/OE to the inside circuits, the outputted signals being in response to the inputted signals. Further, the buffer circuit 100 includes an input/output buffer 150 which is so adapted as to receive a chip-enabling signal/CE and output-enabling signal/OE to be supplied from the CE buffer 120 and the OE buffer 140 to the inside circuit, when the chip-enabling signal/CE is turned to be a low level which indicates an enabling state and the output-enabling signal/OE is turned to a low level which indicates a data reading state, data $D_j$ ($j$=0–7) read out from the inside circuit are outputted to the outside through the data pads $1g$.

The input/output buffer 150 also functions as a circuit which is so adapted as to receive the write-enabling signal/WE to be supplied from the WE buffer 130 to the inside circuits, and is so adapted that when the chip-enabling signal/CE is turned to a low level which indicates an enabling state and the write-enabling signal/WE is turned to a low level which indicates the program mode, the erase mode or the test mode, data $D_0$–$D_7$ received from the outside through the data pads $1g$ are outputted as command data $COM_j$ or program data $D_j$.

The flash memory FM further comprises a CPU (central processing unit) 200 which receives the chip-enabling signal/CE, the write-enabling signal/WE and the output-enabling signal/OE from the CE buffer 120, the WE buffer 130 and the OE buffer 140 respectively as well as the command data $COM_j$ from the input/output buffer 150 and which outputs a control signal CTRL in response to each of these signals. The control signal CTRL is represented as a generic term indicating various kinds of control signals. Further, the CPU 200 is so adapted that when the chip-enabling signal/CE supplied to the inside is turned to a low level indicating an enabling state and the write-enabling signal/WE to be supplied to the inside is turned to a low level indicating the program mode, the erase mode or the test mode, it receives, as the command data $COM_j$, the data $D_0$–$D_7$ received from the outside through the data pads 1g to change the control signal CTRL in response to the command data $COM_j$. For example, when 8 bit command data $COM_j$ indicate 41H (41 in a 16 code system), namely, $COM_7$, $COM_6, \ldots, COM_0$=0, 1, 0, 0, 0, 0, 0, 1, the CPU 200 outputs the control signal CTRL indicating the program mode. When the 8 bit command data $COM_j$ indicate 20H i.e., $COM_7, COM_6, \ldots, COM_0$=0, 0, 1, 0, 0, 0, 0, 0, the control signal CTRL indicates the erase mode. Further, when the command data $COM_j$ indicate 81H, i.e., $COM_7, COM_6, \ldots$, $COM_0$=1, 0, 0, 0, 0, 0, 0, 1, the CPU 200 instructs the special test mode wherein a reading operation is conducted by turning a low level potential VL in a word line to be a negative potential.

Further, the flash memory FM comprises a low level potential applying circuit 300 for outputting a low level potential VL to word lines. The low level potential applying circuit 300 turns the low level potential VL applied to the word lines to a negative potential when a negative potential is received from the outside in the special test mode wherein the reading operation is conducted by rendering the low level potential VL in the word lines to be a negative potential, and the low level potential VL applied to the word lines is turned to the ground potential GND in the ordinary reading mode wherein no negative potential is received from the outside. In this embodiment, the negative potential is −3.3 V.

Further, the flash memory FM has a memory cell array 400 comprising a plurality of non-volatile memory cells in pluralities of rows and columns, and a plurality of word lines 401 provided corresponding to the rows of memory cell and a plurality of main bit lines 402 provided corresponding to the columns of memory cell.

Further, the flash memory FM is provided with a row selection circuit 500 which receives the address signal $ADD_i$ from the address buffer 110, the low level potential VL from the low level potential applying circuit 300 and the control signal CTRL from the CPU 200 wherein when the control signal CTRL indicates the ordinary reading mode, a word line corresponding to the address signal $ADD_i$ is selected among the plurality of word lines 401 in the memory cell array 400 to apply the power source voltage $V_{cc}$ to the selected word line, while a low level potential VL, i.e., a ground potential GND, which is lower than the power source voltage $V_{cc}$ is applied to an unselected word line.

The row selection circuit 500 selects a word line corresponding to the address signal $ADD_i$ among the plurality of word lines 401 when the control signal CTRL indicates the special test mode to apply the power source potential $V_{cc}$ to the selected word line. And, on the other hand, a low level potential VL as a negative potential which is lower than the ground potential GND is applied to an unselected word line. Further, the row selection circuit 500 applies a negative program gate potential VPG (in this embodiment, −8 V) to a word line in response to the address signal $ADD_i$ when the control signal CTRL indicates the program mode. Further, the row selection circuit 500 applies an elevated potential $V_{pp}$ (in this embodiment, 10 V) which is higher than the power source potential $V_{cc}$ to a word line in response to the address signal $ADD_i$ when the control signal CTRL indicates the erase mode. The row selection circuit 500 and the low level potential applying circuit 300 constitute a word line potential applying circuit.

Further, the flash memory FM is provided with a source line potential generating circuit 600 which is so adapted to receive the address signal $ADD_i$ from the address buffer 110 and the control signal CTRL from the CPU 200 wherein when the control signal CTRL indicates the ordinary reading mode or the special mode, a source line having a potential $SL_n$, which responds to the address signal $ADD_i$,m among a plurality of source lines is rendered to have the ground potential GND. The source line potential generating circuit 600 brings the potential $SL_n$ in the plurality of source lines into a floating (open) state when the control signal CTRL indicates the program mode. Further, the source line potential generating circuit 600 renders a source line which is in response to the address signal, among the plurality of source lines each having the potential $SL_n$ to be a negative erase potential VE (in this embodiment, −8 V) when the control signal CTRL indicates the erase mode.

Further, the flash memory FM is provided with a well potential generating circuit 700 which is so adapted to receive the address signal $ADD_i$ from the address buffer 110 and the control signal CTRL from the CPU 200 wherein when the control signal CTRL indicates the ordinary reading mode or the special mode, a potential $VW_n$ in a plurality of wells in which memory cells in the memory cell array 400 are formed is turned to the ground potential GND. The well potential generating circuit 700 changes the potential $VW_n$ of the plurality of wells to the ground potential GND when the control signal CTRL indicates the program mode. Further, the well potential generating circuit 700 turns the well potential $VW_n$, which is in response to the address signal, among the plurality of well potential $VW_n$ to a negative erase potential VE.

Further, the flash memory FM is provided with a column selection circuit.sense amplifier 800 which functions as follows. It receives the address signal $ADD_i$ from the address buffer 110 and the control signal CTRL from the CPU 200, and when the control signal CTRL indicates the ordinary reading mode or the special mode, a reading potential VR (in this embodiment, 1 V) is applied to a main bit line 402, which is in response to the address signal $ADD_i$, among a plurality of main bit lines 402 in the memory cell array 400, and it outputs data $D_j$ having a high level or a low level depending on whether or not an electric current flows in the main bit line. The column selection circuit.sense amplifier 800 applies a program drain potential VPD (in this embodiment, 6 V) to a main bit line 402, which in response to the high level data in the address signal $ADD_i$ and the data $D_j$, among the plurality of main bit lines 402 when the control signal CTRL indicates the program mode. Further, column selection circuit.sense amplifier 800 turns a potential $MBL_m$ in the plurality of main bit lines 402 to a floating (open) state when the control signal CTRL indicates the erase mode.

Figure 2:
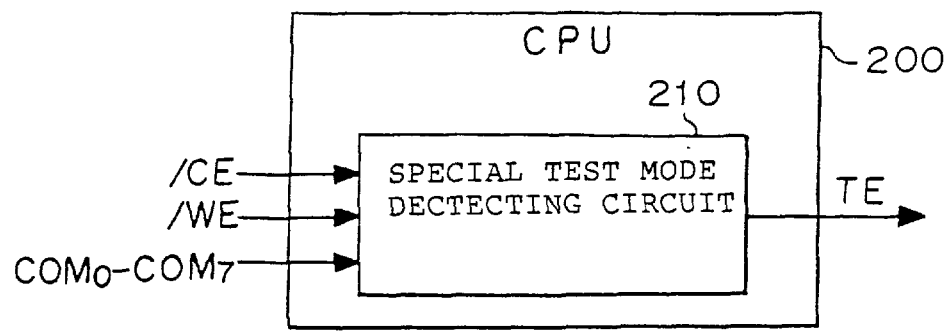
FIG. 2 is a block diagram showing CPU in the flash memory of Embodiment 1 of the present invention.

Description will be made as to a part of circuit in the CPU 200 with reference to FIG. 2. In FIG. 2, the CPU 200 includes a special test mode detecting circuit 210 to output a special test mode signal TE, which is contained in the control signal CTRL, in response to the chip-enabling signal/CE and the write-enabling signal/WE to be supplied to the inside circuits and the command data $COM_0$–$COM_7$. The special test mode detecting circuit 210 has such a function that when both the chip-enabling signal/CE and the write-enabling signal/WE are changed to be a low level at the initial stage of operating cycle, it judges the data $D_0$–$D_7$ supplied to the input/output buffer 150 to be the command data $COM_0$–$COM_7$, and further, it detects the command data indicating "81H" which means the special test mode whereby the special test mode signal TE is turned to a high level which represents the special test mode.

Figure 3:
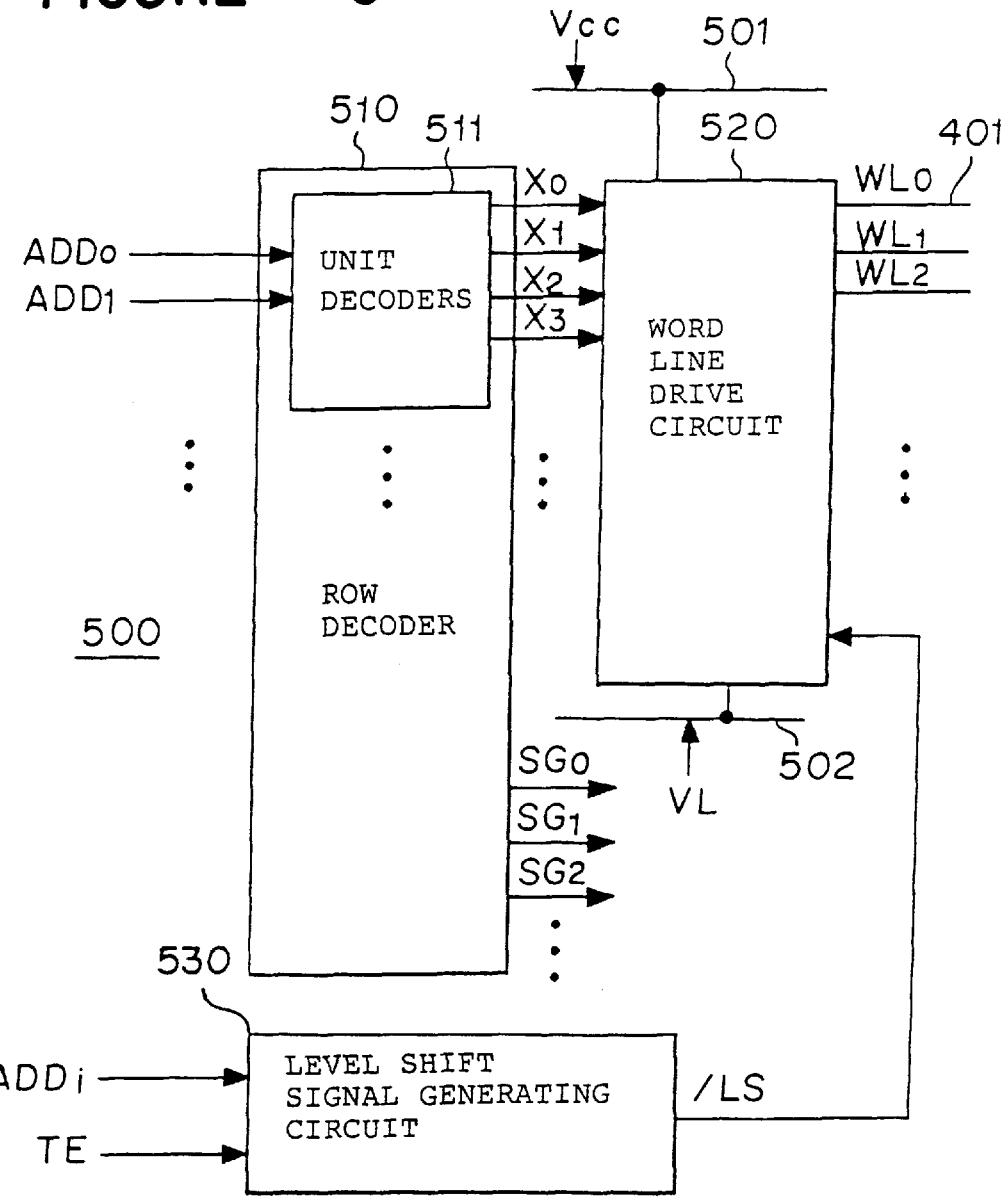
FIG. 3 is a block diagram showing a row selection circuit in the flash memory of Embodiment 1.

FIG. 3 shows an example of the row selection circuit 500. In FIG. 3, the row selection circuit 500 includes a potential line 501 which is applied with a power source potential $V_{cc}$ and a potential line 502 which is applied with a low level potential VL. Further, the row selection circuit 500 includes a row decoder 510 which decodes the address signal $ADD_i$ to output row decode signals $X_0$, $X_1$, $X_2$, $X_3$, . . . having amplitudes between the power source voltage $V_{cc}$ and the ground potential GND. The row decoder 510 includes a plurality of unit decoders 511 each of which renders one of four row decode signals to be the power source potential $V_{cc}$ and the remaining three to be the ground potential GND in response to two bits in the address signal $ADD_i$. Further, the row decoder 510 generates a plurality of gate selection signals $SG_0$, $SG_1$, $SG_2$, . . . in which any signal in response to the address signal $ADD_i$ is turned to a high level which indicates the selection.

The row selection circuit 500 includes a word line drive circuit 520 connected to the potential line 501 and the potential line 502 so that a potential in the word line(s) 401 selected in response to the row decode signals $X_0$, $X_1$, $X_2$, $X_3$, . . . is rendered to be the potential of the potential line 501, and a potential in non-selective word line(s) 401 is rendered to be the potential of the potential line 502.

Further, the row selection circuit 500 includes a level shift signal generating circuit 530 which receives the address signal $ADD_i$ and the special test mode signal TE to generate a level shift signal/LS in response to any of these signals. The level shift generating circuit 530 functions as follows. When the special test mode signal TE is brought to a high level indicating the special test mode, it detects a change in the address signal $ADD_i$ so that the level shift signal/LS is rendered to a low level indicating the level shift a predetermined time after the change of the address signal $ADD_i$.

Figure 4:
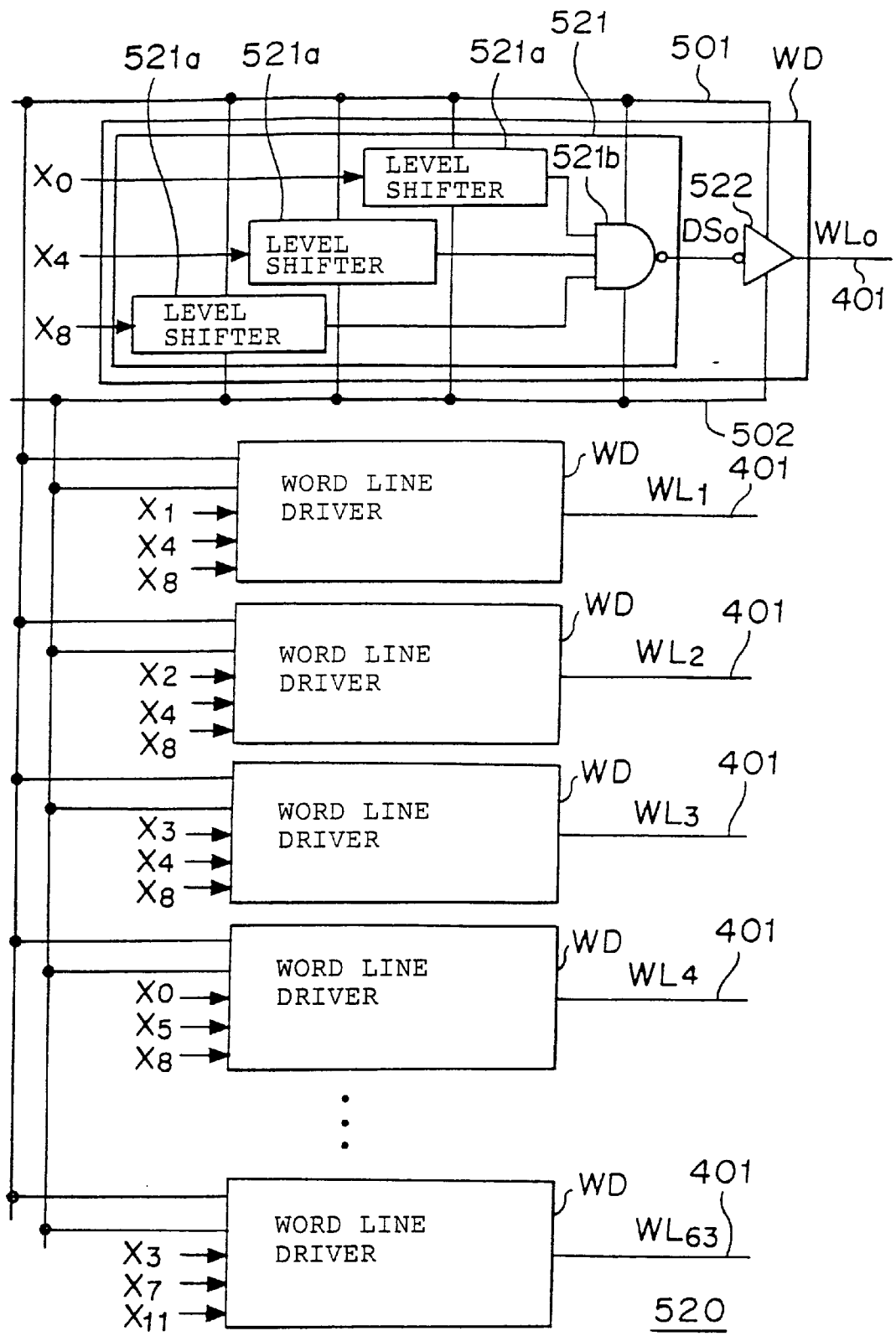
FIG. 4 is a circuit diagram showing a word line drive circuit in the flash memory of Embodiment 1 of the present invention.

FIG. 4 shows an embodiment of the word line drive circuit 520. In FIG. 4, the word line drive circuit 520 includes a plurality of word line drivers WD which correspond to the plurality of word lines 401. Each of the word line drivers WD includes a drive signal generating circuit 521 which is connected to the potential line 501 to receive its potential and the potential line 502, and outputs a drive signal $DS_t$ in response to the decode signals $X_0$, $X_1$, $X_2$, $X_3$, . . . , wherein the drive signal has an amplitude between the potential of the potential line 501 and the potential of the potential line 502. Further, each of the word line drivers WD includes a gate circuit 522 which is driven with the receipt of the potentials of the potential lines 501 and 502 in such a manner that when the corresponding drive signal $DS_t$ is rendered to be the potential of the potential line 502, a potential in the corresponding word line 401 is changed to the potential of the potential line 501, and when the corresponding drive signal $DS_t$ is rendered to be the potential of the potential line 501, a potential of the corresponding word line 401 is changed to the potential of the potential line 502.

The drive signal generating circuit 521 includes level shifters 521a which respectively receive one of row decode signals $X_p$ (p=0, 1, 2, 3), one of row decode signals $X_q$ (q=4, 5, 6, 7) and one of row decode signals $X_r$ (r=8, 9, 10, 11). Further, the drive signal generating circuit 521 includes an NAND circuit 521b which receives the row decode signals $X_p$, $X_q$, $X_r$ which are level-shifted in the level shifters 521a and which renders the corresponding drive signals $DS_t$ to have a potential in the potential line 502 when the row decode signals have respectively the potential of the potential line 501. When the level shift signal/LS from the level shift signal generating circuit 530 is turned to a low level indicating the level-shifting, the level shifters 521a latch and level-shift the corresponding row decode signals $X_p$, $X_q$, $X_r$ so as to supply the signals to the NAND circuit 521b.

Figure 5:
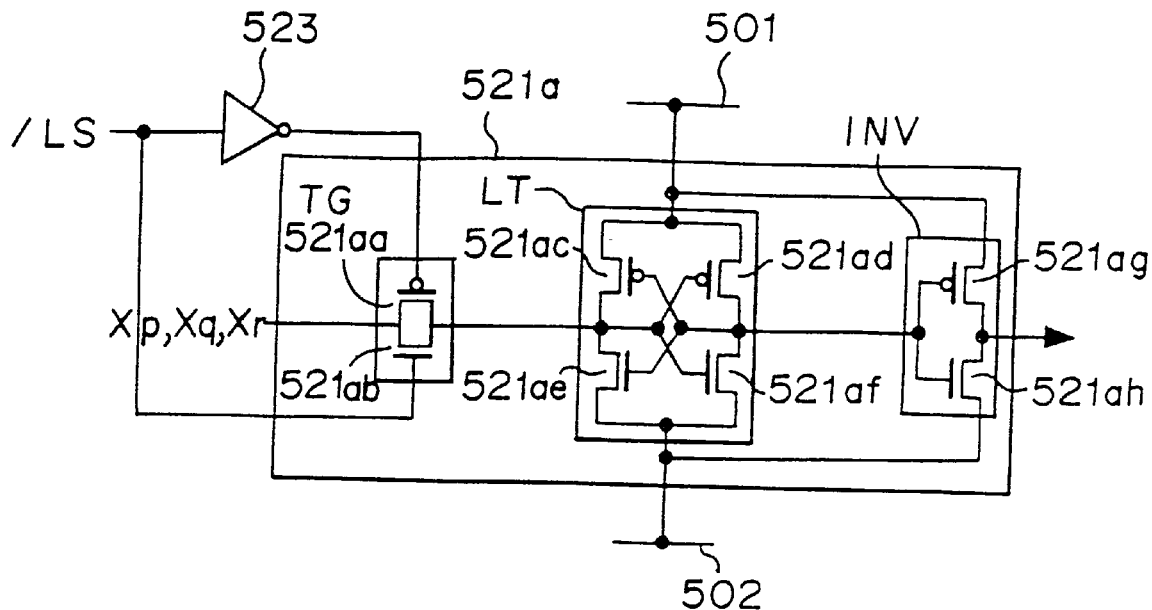
FIG. 5 is a circuit diagram showing a level shifter in the flash memory of Embodiment 1 of the present invention.

FIG. 5 shows an embodiment of any of the level shifters 521a. In FIG. 5, the level shifter 521a includes a transfer gate TG which receives the level shift signal/LS and an inversed signal inverted in an inverter 523. It becomes a non-conductive state when the level shift signal/LS is in a low level indicating the level-shifting. The transfer gate TG comprises a P channel MOS transistor 521aa and an N channel MOS transistor 521ab. Further, the level shifter 521a includes a latch circuit LT for latching and level-shifting the row decode signals $X_p$, $X_q$, $X_r$ received through the transfer gate TG. The latch circuit LT comprises P channel MOS transistors 521ac and 521ad and N channel MOS transistors 521ae and 521af. Further, the level shifter 521a includes an inverter INV which comprises a P channel MOS transistor 521ag and an N channel MOS transistor 521ah.

Figure 6:
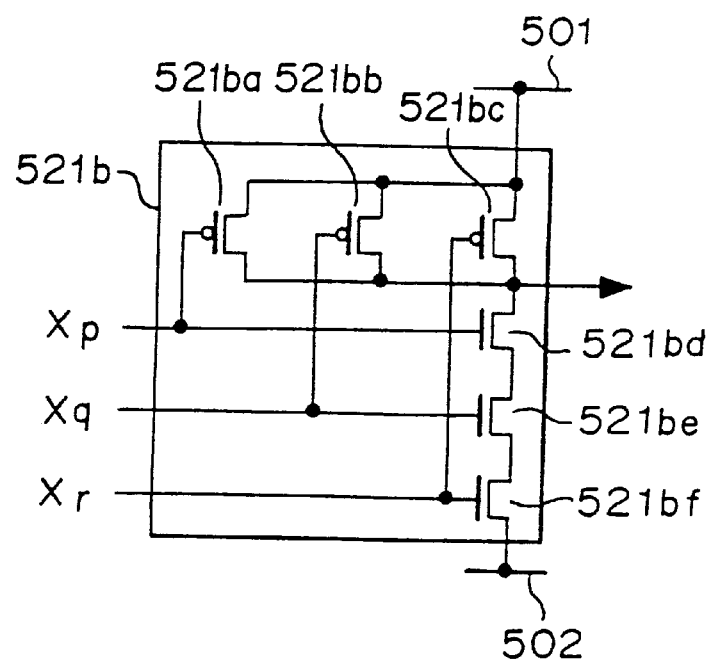
FIG. 6 is a circuit diagram showing an NAND circuit in the flash memory of Embodiment 1 of the present invention.

The NAND circuit 521b in the word line driver WD will be described with reference to FIG. 6. The NAND circuit 521b comprises a P channel MOS transistor 521ba and an N channel MOS transistor 521bd which receive the row decode signal $X_p$; a P channel MOS transistor 521bb and an N channel MOS transistor 521be which receive the row decode signal $X_q$; and a P channel MOS transistor 521bc and an N channel MOS transistor 521bf which receive the row decode signal $X_r$.

Figure 7:
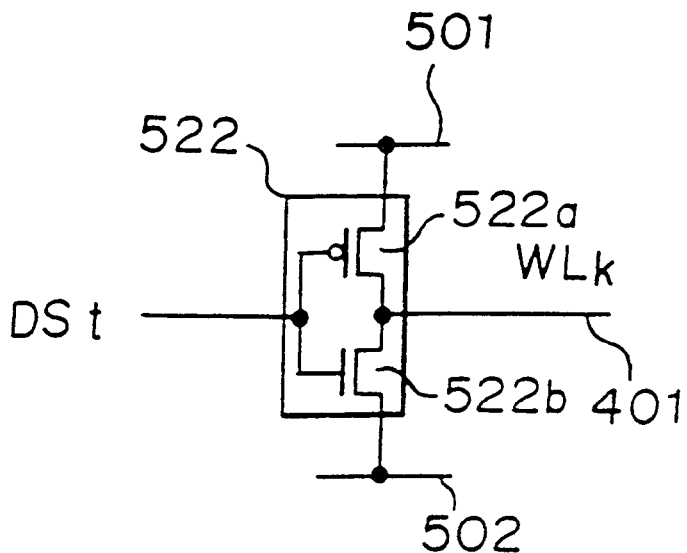
FIG. 7 is a circuit diagram showing a gate circuit in the flash memory of Embodiment 1 of the present invention.

FIG. 7 shows an embodiment of the gate circuit 522 in the word line driver WD. The gate circuit 522 comprises a P channel MOS transistor 522a which is connected between the potential line 501 and one of the word lines 401 and which is turned on when the corresponding drive signal $DS_t$ becomes the potential of the potential line 502, and an N channel MOS transistor 522b which is connected between the potential line 502 and the word line 401 and which is turned on when the corresponding drive signal $DS_t$ becomes the potential of the potential line 501.

Figure 8:
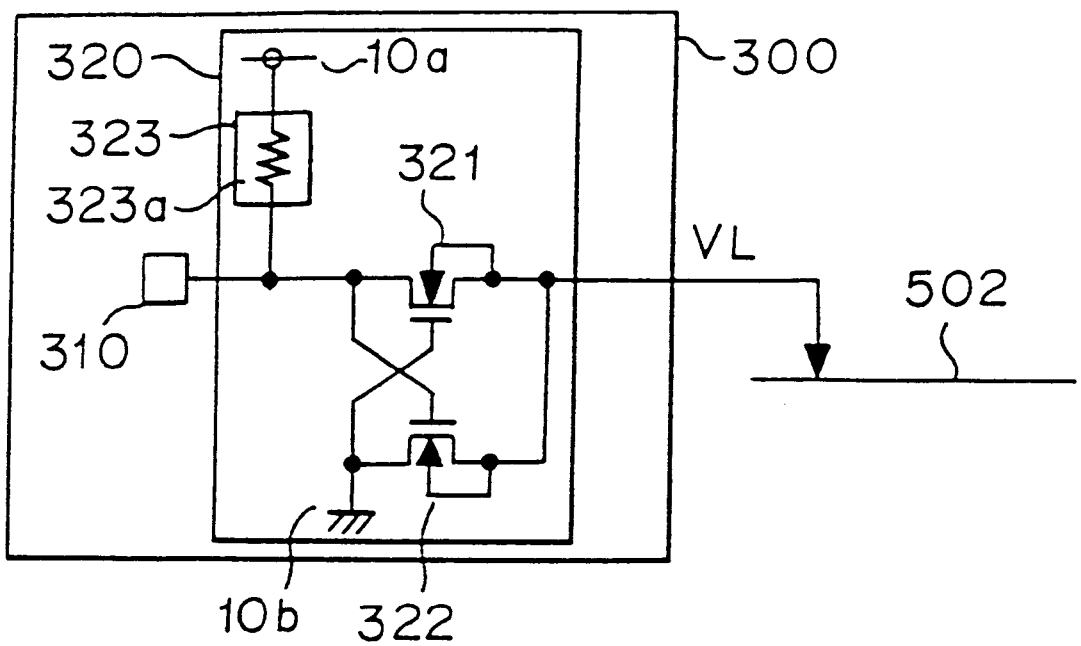
FIG. 8 is a circuit diagram showing a low level potential applying circuit in the flash memory of Embodiment 1 of the present invention.

FIG. 8 shows the low level potential applying circuit 300. The low level potential applying circuit 300 includes a pad 310 to which a negative potential lower than the ground potential GND is applied from the outside during special test mode. Further, the low level potential applying circuit 300 includes a low level switching circuit 320 which electrically connects the pad 310 to the potential line 502 when the pad 310 is applied with a negative potential and which applies the ground potential GND to the potential line 502 in the ordinary reading mode. The pad 310 is connected to the potential line 502 through the low level switching circuit 320. The low level switching circuit 320 includes an N channel MOS transistor 321 which is connected between the pad 310 and the potential line 502 and which has a gate connected to a ground potential node 10b to which the ground potential GND supplied from the earth pad 1b is applied, and a back gate connected to the potential line 502. Further, the low level switching circuit 320 includes an N channel MOS transistor 322 which is connected between the ground potential node 10b and the potential line 502 and which has a gate connected to the pad 310 and a back gate connected to the potential line 502. Further, the switching circuit 320 includes a charging circuit 323 for charging the gate of the N channel MOS transistor 322. The charging circuit 323 includes a resistance element 323a having a high resistance value which is connected between a power source potential node 10a to which the power source potential $V_{cc}$ from the power source pad 1a is applied and the gate of the N channel MOS transistor 322.

In the ordinary reading mode where a negative potential is not applied to the pad 310, a gate potential in the N channel MOS transistor 322 is increased to the power source potential $V_{cc}$ by means of the charging circuit 323 whereby the N channel MOS transistor 322 becomes a conductive state. Then, the potential line 502 is electrically connected to the ground potential node 10b through the N channel MOS transistor 322, and the potential VL of the potential line 502 becomes the ground potential GND.

When a negative potential is applied to the pad 310 in the special test mode, the gate potential of the N channel MOS transistor 322 becomes a negative potential because the resistance element 323a has a high resistance value and an amount of electric charge discharged through the pad 310 is larger than an amount of electric charge to the gate of the N channel MOS transistor 322 by means of the charging circuit 323. The source potential of the N channel MOS transistor 321 becomes also a negative potential and the gate is at the ground potential GND. Accordingly, when a voltage across the gate and the source is larger than the threshold voltage of the N channel MOS transistor 321, the N channel MOS transistor 322 becomes a conductive state, and the potential line 502 and the pad 310 are electrically connected through the N channel MOS transistor 321 whereby the potential VL of the potential line 502 becomes a negative potential.

Figure 9:
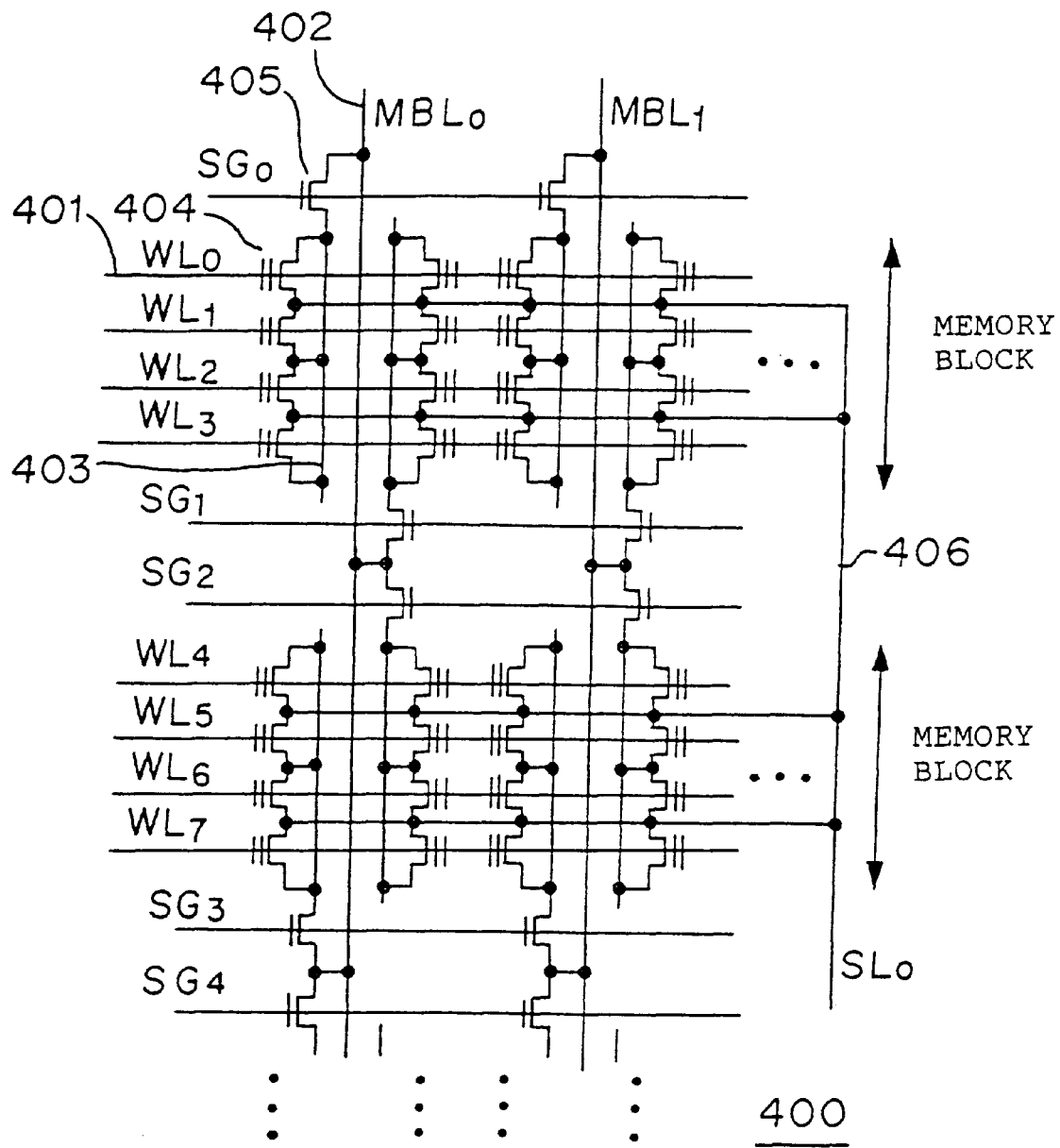
FIG. 9 is a circuit diagram showing a memory cell array in the flash memory of Embodiment 1 of the present invention.

FIG. 9 shows an embodiment of the memory cell array 400. In FIG. 9, the memory cell array 400 comprises a plurality of word lines 401, a plurality of main bit lines 402 which cross the word lines 401 and subbit lines 403 each of which is arranged to cross the word lines 401 and is connected to the corresponding main bit 402 through a selection gate 405. Further, the memory cell array 400 includes a plurality of non-volatile memory cells 404 which are disposed in a corresponding relation at the intersections between the subbit line 403 and the word lines 401. Each of the non-volatile memory cells 404 comprises a drain connected to the corresponding subbit line 403, a source.floating gate connected to the source line 406 and a control gate connected to the word line 401 corresponding thereto. The selection gate 405 is controlled by gate selection signals $SG_0$, $SG_1$, . . . so that the subbit line 403, to which the memory cells 404 designated and selected in response to the address signal ADD is connected, becomes an electrically conducting state through the corresponding main bit line 402 and the selection gate 405 when data are read out during the program mode, the ordinary reading mode and the special test mode.

Figure 10:
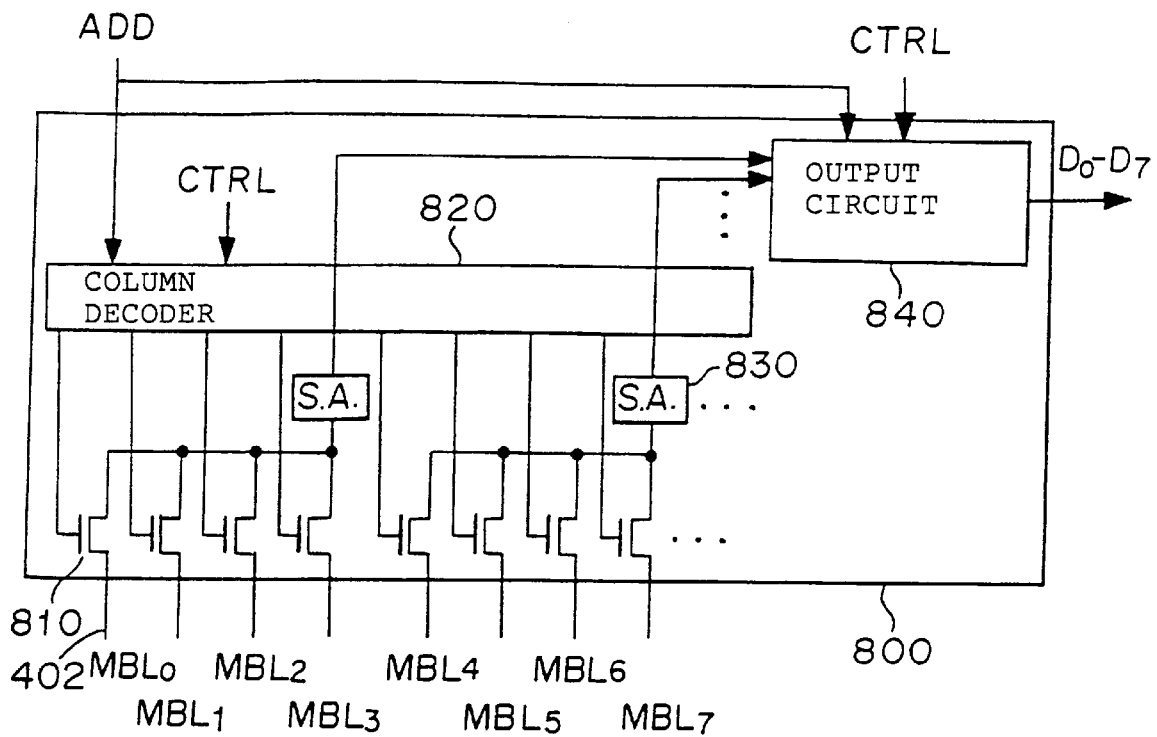
FIG. 10 is a block diagram showing a column selection circuit and a sense amplifier in the flash memory of Embodiment 1 of the present invention.

FIG. 10 shows an embodiment of the column selection circuit.sense amplifier 800. In FIG. 10, the column selection circuit.sense amplifier 800 includes a plurality of column selection gates 810 between a plurality of main bit lines 402 and a sense amplifier 830 corresponding thereto. Further, the column selection circuit.sense amplifier 800 includes a column decoder 820 which brings any column selection gate 810 in response to the address signal $ADD_i$ into an electrically conducting state when the control signal CTRL indicates the program mode, the ordinary reading mode or the special test mode. Further, the column selection circuit.sense amplifier 800 includes a plurality of sense amplifiers 830 which, in the ordinary reading mode or the special test mode, apply a reading potential to the main bit lines 402 connected through the column selection gates 810, and output a signal of high level when an electric current passes in the main bit lines, while it output a signal of low level when no electric current is passed. Further, the column selection circuit.sense amplifier 800 includes an output circuit 840 which outputs data $D_0$–$D_7$ composed of 8 bit data in response to the address signal $ADD_i$, among signals outputted from the plurality of sense amplifiers 830 when the control signal CTRL indicates the ordinary reading mode or the special test mode.

Figure 11:
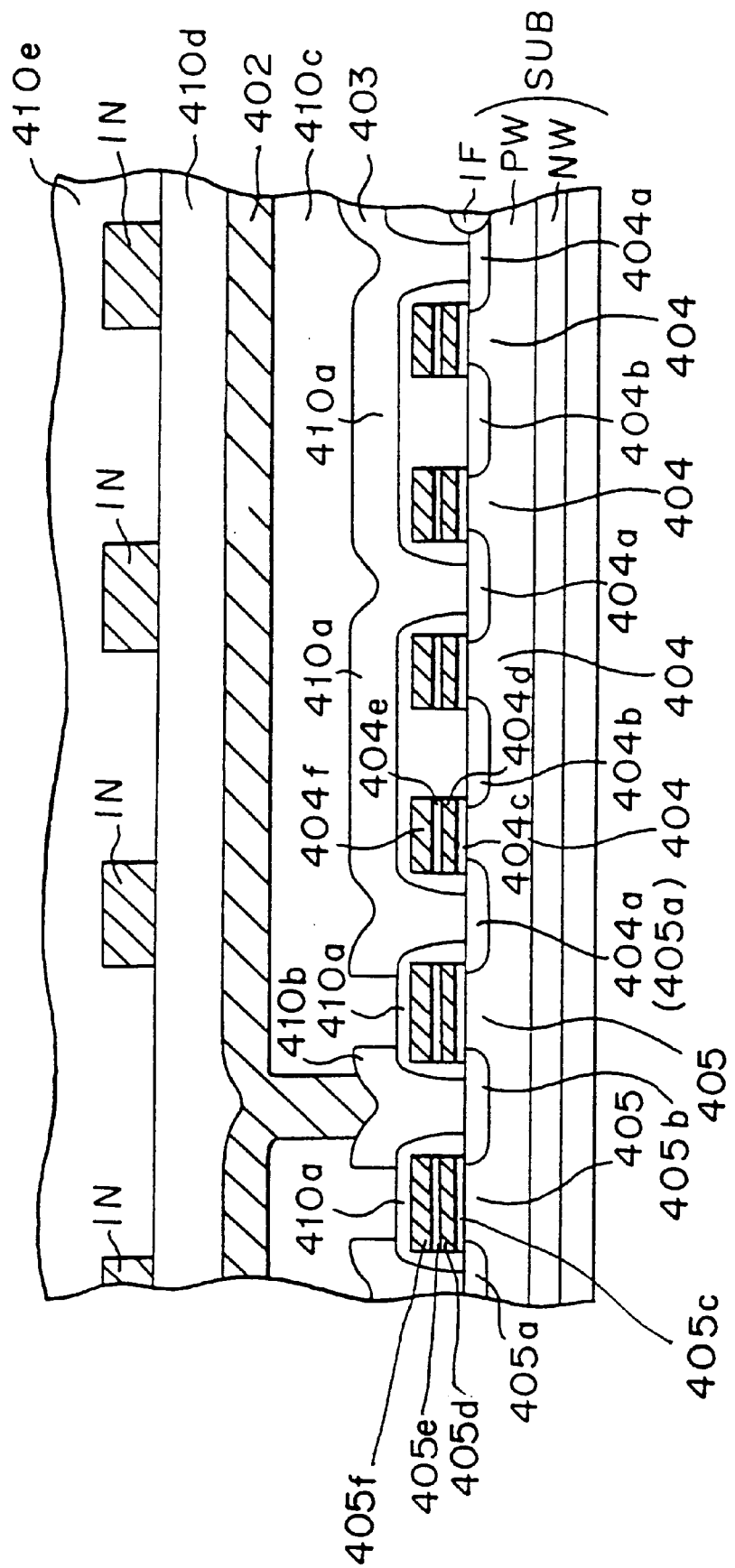
FIG. 11 is a cross-sectional view showing the construction of the flash memory of Embodiment 1 of the present invention.
Figure 12:
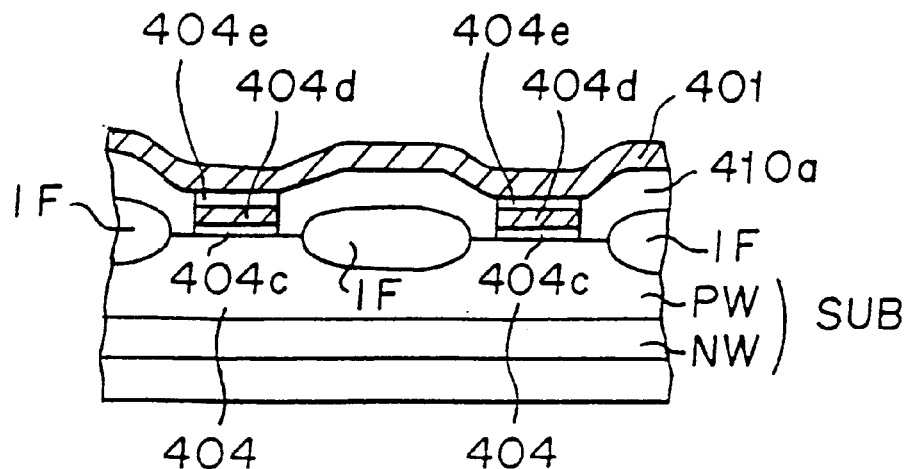
FIG. 12 is a cross-sectional view showing the construction of the flash memory of Embodiment 1 of the present invention.

FIGS. 11 and 12 are respectively cross-sectional views of an embodiment of the semiconductor substrate in which the memory cell array 400 is formed. FIG. 11 shows a cross section of the semiconductor substrate taken along the main bit line 402. In FIG. 11, the memory cells 404 are formed in a P well PW. The P well PW is formed in the main surface of a semiconductor substrate SUB and is electrically isolated from a base portion of the semiconductor substrate SUB by means of an N well NW. A well potential $VW_n$ produced from the well potential generating circuit 700 (FIG. 1) is applied to the P well PW. An element separating insulating film IF is formed in the main surface of the semiconductor substrate SUB so as to isolate the memory cells 404 connected to the adjacent subbit line 403.

Each of the memory cells 404 comprises a drain 404a of N type semiconductor region formed in the surface of the P well PW, a source 404b of N type semiconductor region formed in the surface of the P well PW, which is separated from the drain 404a, a floating gate 404d formed in a channel region which is interposed between the drain 404a and the source 404b so as to oppose the P well PW through a gate insulating layer 404c and a control gate 404f formed on the floating gate 404d by interposing an insulating layer 404e. The memory cells 404 which are connected to the same subbit line 403 and are adjacent to each other, commonly own the drain 404a or the source 404b. A potential $WL_k$ in the word line 401 is applied to the corresponding control gate 404f. Further, a potential $SL_n$ in the source line 406 is applied to the corresponding source 404b.

Each of the selection gates 405 comprises a first source/drain 405a of N type semiconductor region formed on the surface of the P well PW, a second source/drain 405b of N type semiconductor region formed on the surface of the P well PW, a floating gate 405d formed in a channel region interposed between the first source/drain 405a and the second source/drain 405b so as to interposing a gate insulating layer 405c, and a control gate 405f formed on the floating gate 405d by interposing an insulating layer 405e. The control gate 405f receives a gate selection signal $SG_y$. Usually, it is unnecessary to form the floating gate 405d in the selection gate 405 because of no need of storing data. In this embodiment, however, the floating gate 405d is formed because it formed by the same manufacturing process as the memory cell 404. The source/drain 405a of the selection gate 405 is commonly owned as the drain 404a of the adjacent memory cell 404. Further, the source/drain 405b is commonly owned by the adjacent selection gate 405.

An insulating layer 410a covers the memory cells 404 and the selection gate 405. The subbit line 403 is formed on a polysilicon layer formed on the insulating layer 410a and is connected to the drains 404a of the memory cells 404 through contact holes opened in the insulating layer 410a. A contact pad 410b is formed of the polysilicon layer or the subbit line 403, and is connected to the second source/drain 405b of the selection gate 405.

An insulating layer 410c is formed on the subbit line 403 and the contact pad 410b. The main bit line 402 is composed of the first aluminum layer on the insulating layer 410c, and is connected to the contact pad 410b through a contact hole opened in the insulating layer 410c. An insulating layer 410d is formed on the main bit line 402. A wiring IN for transmitting signals and supplying a potential such as the power source potential is composed of the second aluminum layer on the insulating layer 410d. An insulating layer 410e is formed on the wiring IN.

FIG. 12 is a cross-sectional view in the direction along the word line 401. A part of the word line 401 opposes the floating gate 404d by interposing the insulating layer 404e to function as the control gate for the memory cell 404.

Figure 13:
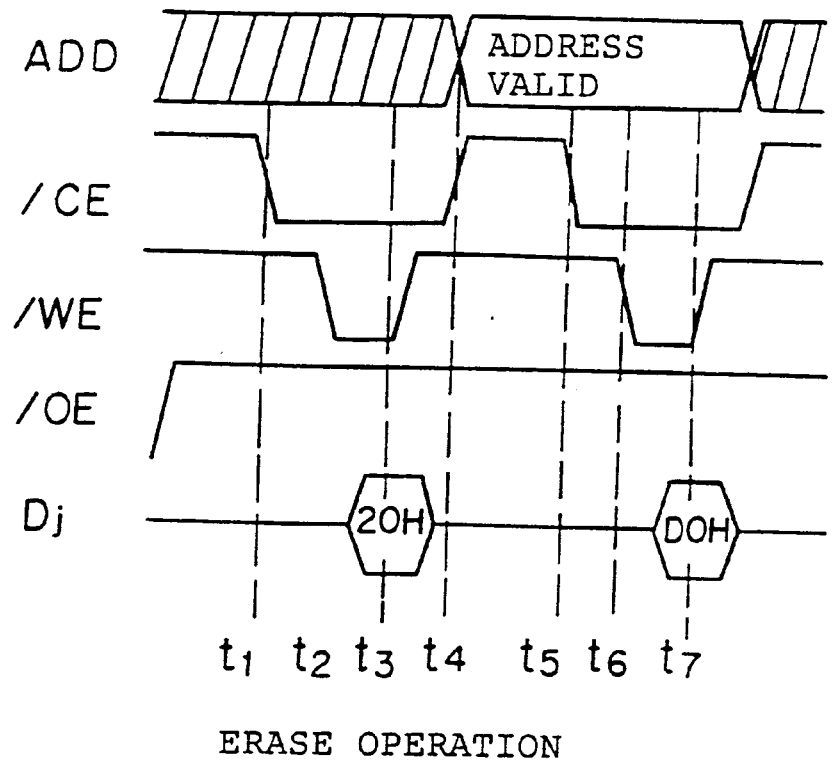
FIG. 13 is a timing chart showing an erase mode of the flash memory of Embodiment 1 of the present invention.

Description will be made as to the erase mode effected by the flash memory FM with reference to FIG. 13.

The erase mode is conducted prior to the program mode. In FIG. 13, when the chip-enabling signal/CE and the write-enabling signal/WE are respectively turned to a low level at a time point $t_1$ and a time point $t_2$, and are turned again to a high level, the flash memory FM takes as command data $COM_j$ the data $D_j$ supplied thereto at a timing at which either of the chip-enabling signal/CE or the write-enabling signal/WE becomes a high level earlier (in FIG. 13, at a time point $t_3$ because the write-enabling signal/WE has gotten a high level earlier). When the CPU 200 detects the command data $COM_j$ indicating "20H", it judges that an instruction of the erase mode has been given. Then, the flash memory FM takes as command data $COM_j$ the data $D_j$ to ask whether or not the erase mode is in fact to be conducted in the same manner as the operations during the time points $t_1$ to $t_3$. The CPU 200, on confirmation that the command data $COM_j$ indicate "DOH", outputs the control signal CTRL instructing the erase mode under the judgment that the erase mode should be conducted.

In response to the control signal CTRL for indicating the erase mode, the source line potential generating circuit 600 turns a potential $SL_n$ in the source line 406 in response to the address signal ADD to −8 V. Further, the well potential generating circuit 700 turns a potential $VW_n$ in the P well PW in response to the address signal ADD to −8 V. Further, the row selection circuit 500 turns a potential $WL_k$ in the word line 401 in response to the address signal ADD to 10 V. Thus, the memory cell 404 in response to the address signal ADD becomes such a state that a voltage of 10 V is applied to the control gate 404f, a voltage of −8 V to the source 404b, and a voltage of −8 V to the P well PW, whereby electrons are implanted to the floating gate 404d through the channel region interposed between the drain 404a and the source 404b, and the threshold value of the memory cells 404 becomes higher than the power source potential $V_{cc}$.

Figure 14:
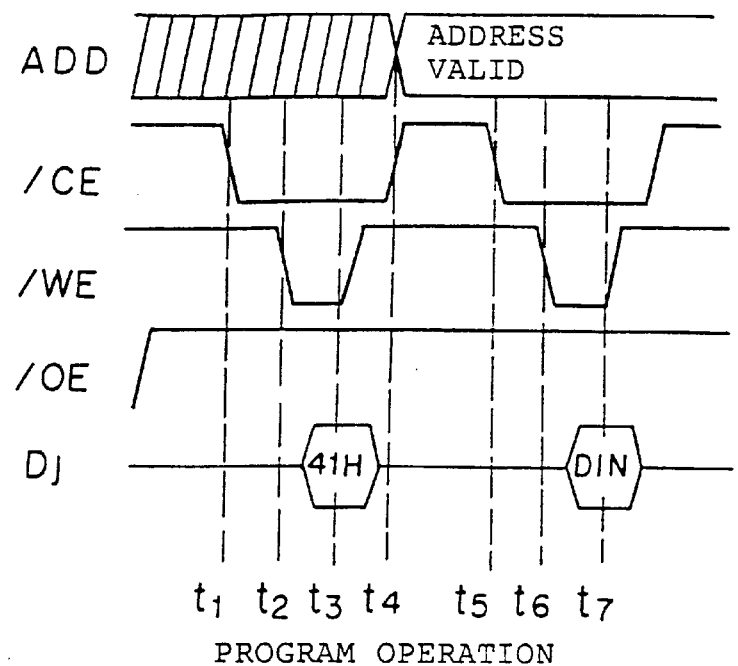
FIG. 14 is a timing chart showing a program mode of the flash memory of Embodiment 1 of the present invention.

FIG. 14 shows the program mode by the flash memory FM.

In FIG. 14, when the chip-enabling signal/CE and the write-enabling signal/WE are respectively turned to a low level at a time point $t_1$ and a time point $t_2$ and are again returned to a high level, the flash memory FM takes, as command data $COM_j$, the data $D_j$ at a timing at which either of the chip-enabling signal/CE or the write-enabling signal/WE becomes the high level earlier (e.g. a time point $t_3$ in FIG. 14, the write-enabling signal/WE has become the high level earlier) in the same manner as the case of the erase mode. On detecting that the command data $COM_j$ are "41H", the CPU 200 judges that an instruction of the program mode has been given. The flash memory FM takes the data $D_j$ as program data in the same manner as the operations from the time point $t_1$ to the time point $t_3$. Further, the CPU 200 makes the control signal CTRL to be in a program indicating state.

In this case, the source line potential generating circuit 600 opens the source line 406, and the well potential generating circuit 700 turns the well potential $VW_n$ to the ground potential GND. Further, the row selection circuit 500 turns the potential $WL_k$ of the word line 401 in response to the address signal ADD to −8 V. Further, the row selection circuit 500 activates the corresponding selection gate 405 so that the subbit line 403 connected with the memory cell 404 in response to the address signal ADD, is connected to the corresponding main bit line 402. Further, the column selection circuit.sense amplifier 800 makes the potential of the main bit line 402 connected with the memory cell 404 which programs the data of high level in the data $D_j$ to be 6 V. Thus, the memory cell 404 which responds to the address signal ADD to program the data of high level is rendered to be a state that a voltage of −8 V is applied to the control gate 404f and a voltage of 6 V is to the drain 404a whereby electrons are moved from the floating gate 404d to the drain 404a, and the threshold value of the memory cell 404 becomes lower than the power source potential $V_{cc}$. Since the voltage of 6 V is not applied to the drain 404a in the memory cell 404 in which the data of low level are programed, electrons are not drawn from the floating gate 404d. Accordingly, the threshold value of the memory cell 404 is still in a state of erasing and is remained higher than the power source potential $V_{cc}$.

Figure 15:
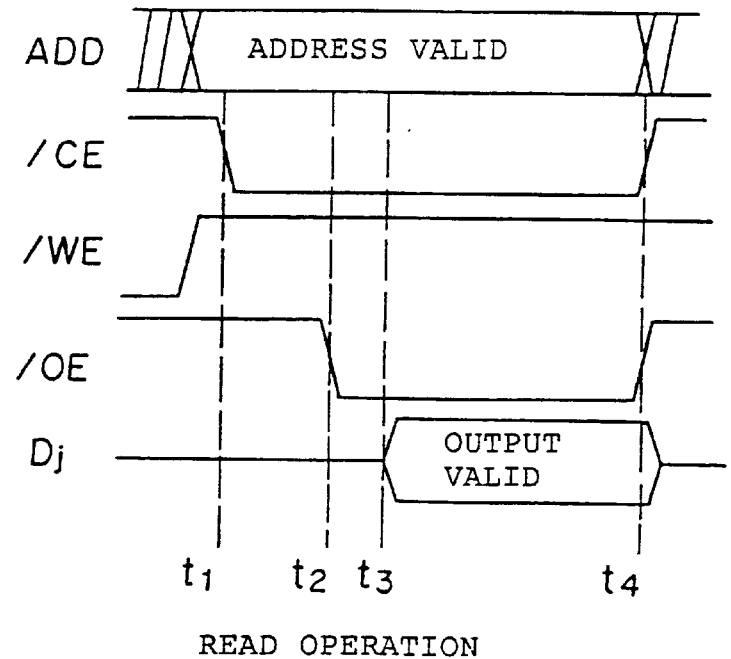
FIG. 15 is a timing chart showing an ordinary reading mode of the flash memory of Embodiment 1 of the present invention.

FIG. 15 shows the ordinary reading mode by the flash memory FM.

In FIG. 15, when the chip-enabling signal/CE is turned to a low level at a time point $t_1$ and the write-enabling signal/WE is remained to be a high level after a predetermined time has passed from the time point $t_1$, the CPU 200 judges that an instruction of the ordinary reading mode has been given, and makes the control signal CTRL to be in an ordinary reading mode indicating state. In response to the state that the control signal CTRL indicates the ordinary reading mode, the source line potential generating circuit 600 turns the potential $SL_n$ of the source line 406 in response to the address signal ADD to the ground potential GND, and the well potential generating circuit 700 turns the well potential $VW_n$ to the ground potential GND.

In the ordinary reading mode, the low level potential VL applied from low level potential applying circuit 300 to the potential line 502 is the ground potential GND, while the power source potential $V_{cc}$ is applied to the potential line 501. Accordingly, among the NAND circuits 521b of the word line drivers WD in the row selection circuit 500, any NAND circuit to which the row decode signals $X_p$, $X_q$, $X_r$ each having a high level are inputted, makes the drive signal $DS_t$ to have the ground potential GND, and the gate circuit 522 which receives the drive signals $DS_t$ turns the potential $WL_k$ of the corresponding word line 401 to the power source potential $V_{cc}$. The gate circuits 522 in the other word line drivers WD turn the potential $WL_k$ of the corresponding word lines 401 to the ground potential GND. Further, the row selection circuit 500 activates the corresponding selection gate 405 so that the subbit line 403 connected with the memory cell 404 in response to the address signal ADD is connected to the corresponding main bit line 402.

Further, the column selection circuit-sense amplifier 800 selects the main bit line 402 to which the memory cell in response to the address signal ADD is connected, and connects the selected main bit line 402 to the corresponding sense amplifier 830, which applies a voltage of 1 V to the selected main bit line 402. As a result, the memory cell 404 which responds to the address signal ADD is rendered to be a state that a voltage of 3.3 V is applied to the control gate 404f, a voltage of 1 V to the drain 404a and a voltage of 0 V to the source 404b. When the threshold voltage value of the memory cell 404 is lower than the power source potential $V_{cc}$, the memory cell 404 becomes an electrically conducting state, and an electric current flows from the main bit line 402 to a circuit of selection gate 405-subbit line 403-drain 404a-source 404b-source line 406. When the threshold voltage value of the memory cell 404 is higher than the power source potential $V_{cc}$, the memory cell 404 becomes a non-conductive state, and no electric current flows in the main bit line 402.

The sense amplifier 830 detects the electric current flowing in the main bit line 402 to output to the output circuit 840 a signal of high level in a case of current flowing and a signal of low level in a case of no current flowing. The output circuit 840 receives outputs from the sense amplifiers 830 to detect 8-bit data in response to the address signal ADD and supplies as reading data D the detected 8-bit data to the input/output buffer 150. The input/output buffer 150, in response to that an outputted enabling signal/OE has become a low level at a time point $t_2$, outputs the read-out data $D_j$ received from the column selection circuit-sense amplifier 800 to the outside at a time point $t_3$.

Figure 16:
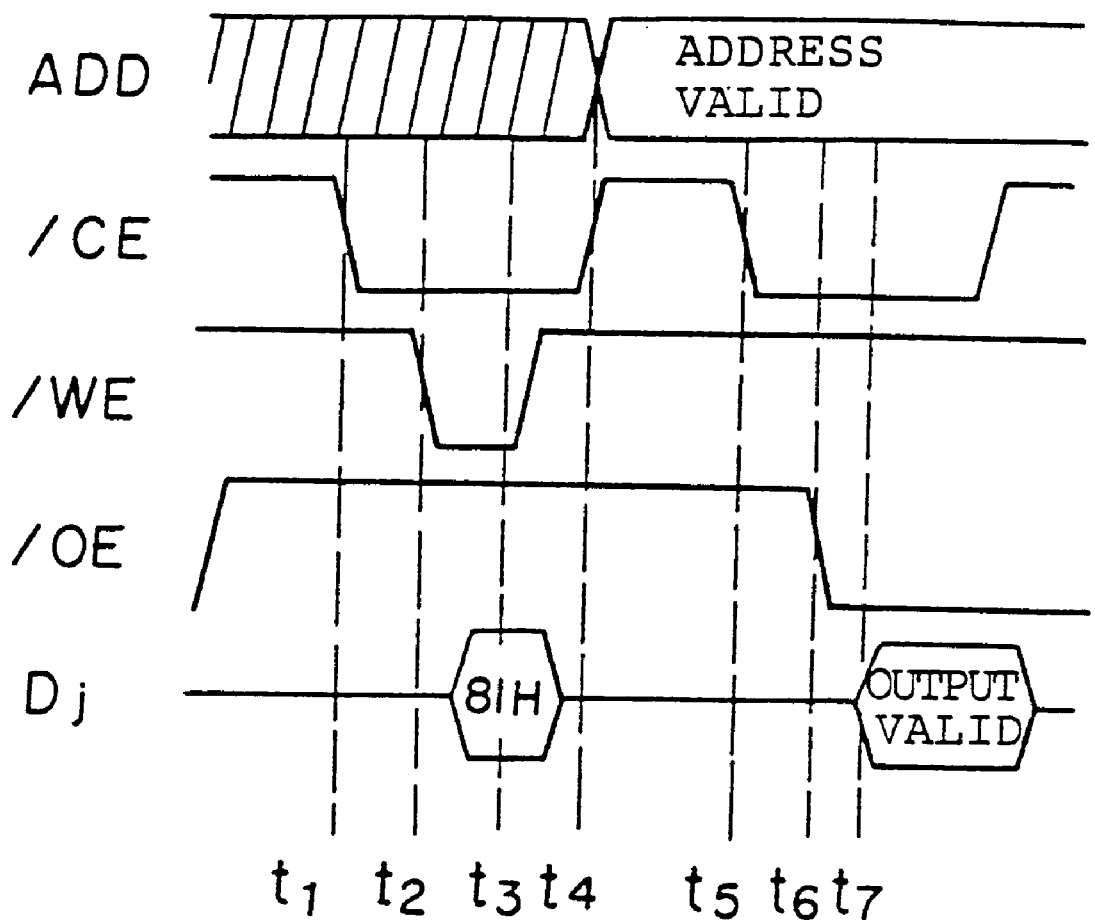
FIG. 16 is a timing chart showing a special test mode of the flash memory of Embodiment 1 of the present invention.

FIG. 16 shows the special test mode by the flash memory FM.

In FIG. 16, when the chip-enabling signal/CE and the write-enabling signal/WE are respectively turned to a low level at a time point $t_1$ and a time point $t_2$ and are again returned to a high level, the flash memory FM takes as command data $COM_j$, the data $D_j$ at a timing at which either of the chip-enabling signal/CE or the write-enabling signal/WE becomes the high level earlier (e.g. a time point $t_3$ in FIG. 16, because the write-enabling signal/WE has become the high level earlier) in the same manner as operations in the erase mode and the program mode.

On detecting that the command data $COM_j$ are "81H", the CPU 200 judges that an instruction of the special test mode has been given, and a special test mode signal TE which is a kind of the control signal CTRL is turned to a high level.

Further, when the write-enabling signal/WE is remained to be a high level, while the chip-enabling signal/CE is turned to a low level at a time point $t_5$, the CPU 200 judges that an instruction of reading in the special test mode has been given, and makes the control signal CTRL to a state that the special test mode is instructed. In response to this, the source line potential generating circuit 600 turns the potential $SL_n$ of the source line 406 in response to the address signal ADD to the ground potential GND, and the well potential generating circuit 700 turns the well potential $VW_n$ to the ground potential GND in the same manner as the ordinary reading mode. Further, in response to that the special test mode signal TE has become a high level, the level shift signal generating circuit 530 in the row selection circuit 500 turns the level shift signal LS to a low level a predetermined time after the address signal ADD has been changed to an effective address at a time point $t_4$.

In response to that the level shift signal/LS becomes the low level, the transfer gate TG in the level shifter 521a of the word line driver WD is rendered to be a non-activated state. In this case, since a predetermined time has passed from the change of the address signal ADD to an effective address at a time point $t_4$, the row decode signals $X_p$, $X_q$, $X_r$ of the address signal ADD indicating an effective address are latched by the latch circuit LT in the level shifter 521a. At this moment, the potential line 501 is at the power source potential $V_{cc}$ and the potential line 502 is at the ground potential GND. Accordingly, the amplitude of the latched signals and signals outputted from the inverter INV is between the power source potential $V_{cc}$ and the ground potential GND. Thereafter, a negative potential of −3.3 V is applied to the pad 310 of the low level potential applying circuit 300 whereby a low level potential VL applied from the low level potential line applying circuit 300 to the potential line 502 assumes a negative potential of −3.3 V.

Then, the signals latched by the latch circuit LT and the signals outputted from the inverter INV are respectively level-shifted into signals each having an amplitude between the power source potential $V_{cc}$ and the negative potential of −3.3 V. Further, the drive signal $DS_t$ outputted from the NAND circuit 521b becomes a signal having an amplitude between the power source potential $V_{cc}$ and the negative potential of −3.3 V. Namely, the potential of the drive signal $DS_t$ of low level which corresponds to the word line 401 selected in response to the address signal ADD is changed from the ground potential GND to the negative potential of −3.3V. The potential of the word line 401 selected in response to the address signal ADD is remained to be the power source potential $V_{cc}$. However, the potential $WL_k$ of non-selected word line 401 is changed from the ground potential GND to the negative potential −3.3 V in response to a change of the potential of the potential line 502. Further, the row selection circuit 500 electrically connects the corresponding selection gate 405 so that the subbit line 403 connected with the memory cell 404 which responds to the address signal ADD is connected to the corresponding main bit line 402, in the same manner as the ordinary reading mode.

Further, as in the same manner as in the ordinary reading mode, the column selection circuit.sense amplifier 800 selects the main bit lint 402 connected with the memory cell 404 which corresponds to the address signal ADD, and connects the selected main bit line 402 to the corresponding sense amplifier 830 so that the sense amplifier 830 applies a voltage of 1 V to the selected main bit line 402. Then, the memory cell 404 in response to the address signal ADD becomes a state that the control gate 404f is applied with 3.3 V, the drain 404a is applied with 1 V and the source 404b is applied with 0 V. When the threshold voltage value of the memory cell 404 is lower than the power source potential $V_{cc}$, the memory cell 404 becomes an electrically conducting state where an electric current flows from the main bit line 403 to a circuit of selection gate 405-subbit line 403-drain 404a-source 404b-source line 406. On the other hand, when the threshold voltage value of the memory cell 404 is higher than the power source potential $V_{cc}$, the memory cell 404 becomes a non-conducting state, and no current flows in the main bit line 402.

The sense amplifier 830 detects an electric current flowing in the main bit line 402 to output to the output circuit 840 a high level signal in a case of current flowing and a low level signal in a case of no current flowing in the same manner as the ordinary reading mode. The output circuit 840 receives outputs from the sense amplifiers 830 to detect 8-bit data in response to the address signal ADD and supplies as the data $D_j$ the detected 8-bit data to the input/output buffer 150. The input/output buffer 150, in response to that the output-enabling signal/OE is turned to a low level at a time point $t_6$, outputs the read-out data $D_j$ received from the column selection circuit.sense amplifier 800 to the outside at a time point $t_7$.

As described above, according to the flash memory FM of embodiment 1 of the present invention, the potential of the unselected word line 401 is rendered to be a negative potential. Accordingly, it is possible to read out for evaluation the data of the memory cell 404 connected to the subbit line 403 which is connected to the other over-programmed memory cell 404 in which electrons are excessively drawn from the floating gate 404d in the program mode whereby the threshold voltage value of the over-programmed memory cell 404 is lower (e.g., −1 V) than the ground potential GND.

Assuming that the threshold voltage value of a certain memory cell 404, for instance, a memory cell 404, shown at the left end in FIG. 9, whose control gate is applied with a potential $WL_1$ in a word line 401, becomes negative due to an over-program, and the threshold voltage value of another memory cell 404, shown at the left end in FIG. 9, which is connected to the same subbit line 403 as the over-programmed memory cell 404 whose control gate is applied with a potential $WL_0$ in a word line 401, is higher than the power source potential $V_{cc}$, and a reading operation is to be conducted to the memory cell 404 having a higher threshold voltage value.

The potential $WL_0$ of the word line 401 is brought to be the power source potential $V_{cc}$, however, the threshold voltage value of the memory cell 404 for which the reading operation is conducted is higher than the power source potential $V_{cc}$. Accordingly, the memory cell 404 becomes a non-conducting state. In such state, no current flows in a circuit of main bit line 402-selection gate 405-subbit line 403-source line 406. Accordingly, the output from the corresponding sense amplifier 830 must be high in level. However, when the potential $WL_1$ of the unselected word line 401 is merely the ground potential GND, the threshold voltage value of the over-programmed memory cell 404 is negative whereby it becomes an electrically conducting state even though the potential $WL_1$ of the word line 401 is in the ground potential GND indicating a non-selection state, and an electric current flows from the main bit line 402 to a circuit of selection gate 405-subbit line 403-the drain 404a of the over-programmed memory cell 404-the source 404b of the over-programmed memory cell 404-source line 406. It results that the output of the corresponding sense amplifier 830 becomes low level when the potential $WL_1$ of the unselected word line 401 is merely the ground potential GND (originally, the output of the corresponding sense amplifier 830 would be high in level). Occurrence of such erroneous reading makes impossible to evaluate correctly the memory cell 404 connected to the same subbit line 403 as the over-programmed memory cell 404.

In the ordinary state of using the flash memory FM, erroneous reading can be avoided by using an over-programmed recovery or an ECC (Error Correction Check) which can detect an over-programmed memory cell 404 in the program mode to reduce the threshold value, which is lower than the ground potential GND, to have a level lower than the power source potential $V_{cc}$ and higher than the ground potential (e.g., 1 V). However, such measures are not often employed for chip evaluation (test mode).

In Embodiment 1 of the present invention, since the potential of the unselected word line 401 can be rendered to be a negative potential which is lower than the ground potential GND, the over-programmed memory cell 404 is brought into a non-conductive state in a non-selection time, and evaluation of the memory cell 404 connected to the same subbit line 403 can be conducted without any influence by the over-programmed memory cell 404.

Further, since a negative potential is applied to the unselected word line from the outside, a circuit for generating a negative potential and a switching circuit relating thereto are unnecessary. Accordingly, the size of the chip can be reduced.

Further, in this embodiment, the drive signal $DS_t$ of low level which is inputted to the gate circuit 522 is level-shifted from the ground potential GND to a negative potential. Accordingly, even when a negative potential is applied to the potential line 502 in a case that the drive signal $DS_t$ is at a negative potential, a gate-source voltage of the N channel MOS transistor 522b in the gate circuit 522 is 0 V whereby the transistor 522b is in a non-conductive state. At this moment, the P channel MOS transistor 522a is in an electrically conducting state and the potential $V_{cc}$ is applied to the word line 401. On the other hand, when the potential of the drive signal $DS_t$ of low level is remained to be the ground potential GND without subjecting to level-shifting, and a negative voltage of −3.3 V is applied to the potential line 502, the gate-source voltage of the N channel MOS transistor 522b is 3.3 V, which is beyond the threshold voltage value of the N channel MOS transistor 522b. Accordingly, the N channel MOS transistor 522b becomes an electrically conducting state. At this moment, the P channel MOS transistor 522a is in an electrically conducting state with the result that the shortcircuit current is passed from the potential line 501 through the P channel MOS transistor 522a and the N channel MOS transistor 522b to the potential line 502. On the other hand, in Embodiment 1 of the present invention, no shortcircuit current is produced since the potential of the drive signal $DS_t$ of low level is level-shifted from the ground potential GND to a negative potential as described above.

Further, in Embodiment 1 of the present invention, the transfer gate TG of the level shifter 521a is a non-activation state when a negative potential is applied to the potential line 502. Accordingly, even when there produces a difference of level between the signals latched by the latch circuit LT and the row decode signals $X_p$, $X_q$, $X_r$ of low level, there is no danger of collision of both signals whereby no current flows from the row decoder 510 to the potential line 502.

Embodiment 2

The flash memory according to another embodiment of the present invention will be described with reference to FIG. 17. In Embodiment 1, the word line drivers WD in the row selection circuit 500 are driven by receiving potentials in the potential lines 501 and 502. On the other hand, in Embodiment 2, word line drivers WD are driven by receiving a potential $V_{P2}$ which is higher than the potential applied to the potential line 501 and a potential $V_{N2}$ which is lower than the negative voltage applied to the potential line 502 in the special test mode. Thus, the circuit structure of the word line drivers WD is different from that of Embodiment 1.

In the following, description is made on the different point, and the description on the same characteristic features is omitted.

Figure 17:
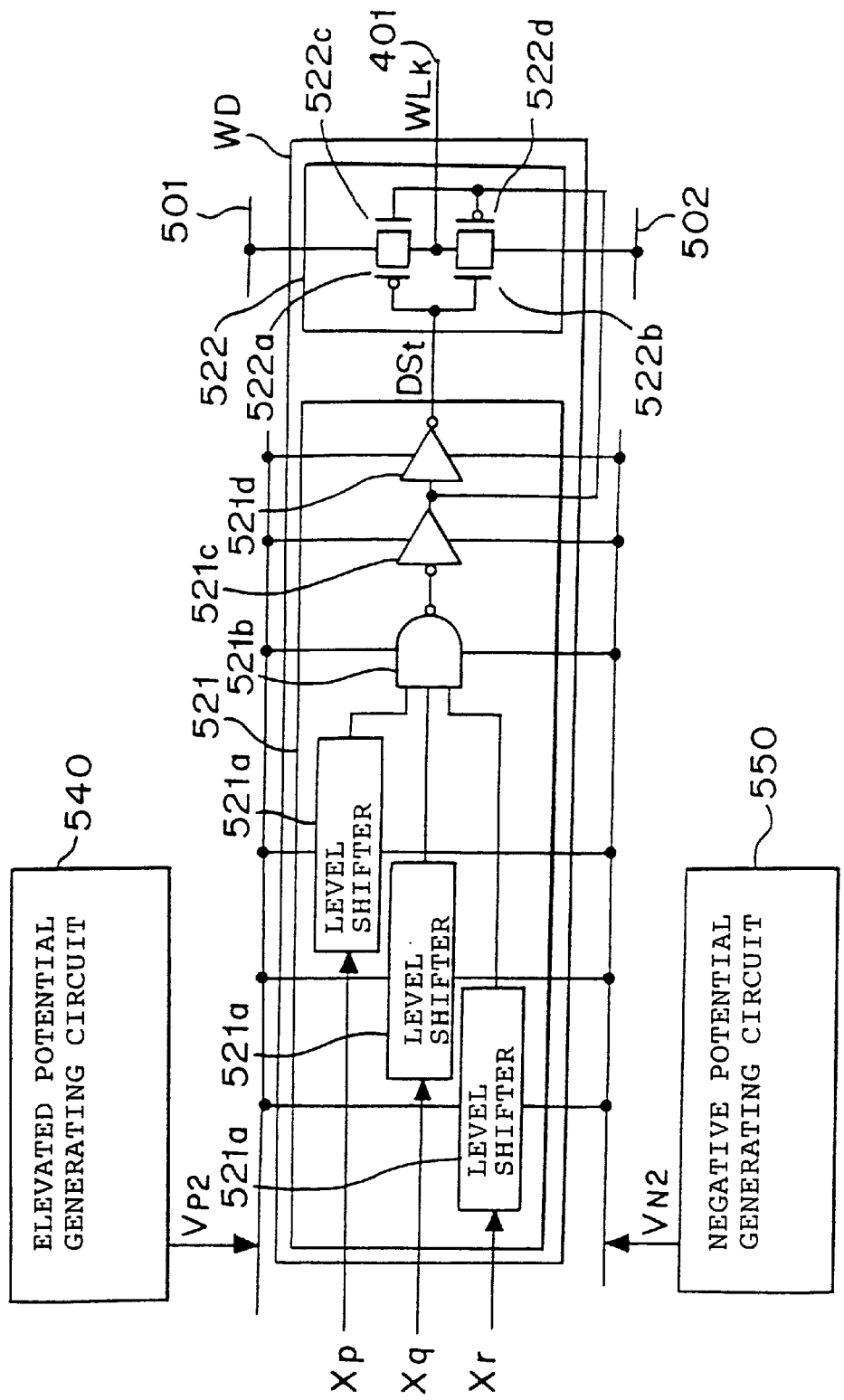
FIG. 17 is a circuit diagram showing a word line driver in the flash memory according to Embodiment 2 of the present invention.

In FIG. 17, the row selection circuit 500 includes an elevated potential generating circuit 540 for generating an elevated potential $V_{P2}$, which is higher than the potential applied to the potential line 501, based on the power source potential $V_{cc}$ and the ground potential GND, and a negative potential generating circuit 550 for generating a negative potential $V_{N2}$, which is lower than the negative potential applied to the potential line 502 in the special test mode, based on the power source potential $V_{cc}$ and the ground potential GND. The drive signal generating circuit 521 in each of the word line drivers WD is driven by receiving the elevated potential $V_{P2}$ and the negative potential $V_{N2}$. The drive signal generating circuit 521 generates the drive signal $DS_t$ having an amplitude between the elevated potential $V_{P2}$ and the negative potential $V_{N2}$, in response to the row decode signals $X_p$, $X_q$, $X_r$ having an amplitude between the power source potential $V_{cc}$ and the ground potential GND. Further, the drive signal generating circuit 521 includes inverters 521c and 521d which have the same construction as the inverter INV shown in FIG. 5. The gate circuit 522 comprises an N channel MOS transistor 522c and a P channel MOS transistor 522d each having a gate for receiving an output from the inverter 521c.

The flash memory FM according to Embodiment 2 performs the same function and effect as Embodiment 1.

Thus, according to the present invention, it is possible to obtain a non-volatile semiconductor device capable of evaluating first memory cells connected with bit lines to which second memory cells are connected, wherein the threshold value of the second memory cells is lower than a non-selection level in the word lines.

Further, a non-volatile semiconductor device for suppressing a shortcircuit current produced in the P channel drive transistor and the N channel drive transistor in the gate circuit, can be obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A non-volatile semiconductor memory device which comprises:
   a bit line,
   a plurality of word lines arranged to cross said bit line,
   a plurality of non-volatile memory cells which are disposed at the crossing points of said bit line and said word lines and which have a drain connected to said bit line and a control gate connected to the corresponding word line, and
   a word line potential applying means wherein in an ordinary reading mode, a selective potential is applied to a word line selected from said plurality of word lines, while a non-selective potential, which is lower than said selective potential, is applied to unselected word lines in response to an address signal, and in a prescribed mode, said selective potential is applied to a word line selected from said plurality of word lines, while a prescribed potential, which is lower than said non-selective potential, is applied to said unselected word lines in response to an address signal.

2. A non-volatile semiconductor memory device according to claim 1, wherein said word line potential applying means comprises:
   the first potential line for supplying said selective potential,
   the second potential line for supplying said non-selective potential and said prescribed potential,
   a row selection circuit which is connected to said first and second potential lines so that the potential of said first potential line is applied to the word line selected from said plurality of word lines, while a potential of said second potential line is applied to the unselected word lines in response to said address signal, and
   a low level potential applying circuit wherein in said ordinary reading mode, said non-selective potential is applied to said second potential line, and in said prescribed mode, said prescribed potential is applied to said second potential line.

3. A non-volatile semiconductor memory device according to claim 2, wherein said low level potential applying circuit includes a pad connected to said second potential line, which is applied with said prescribed potential from the outside in said prescribed mode.

4. A non-volatile semiconductor memory device according to claim 3, wherein said low level potential applying circuit includes a low level switching circuit which is so adapted that when said prescribed potential is applied to said pad, the pad is electrically connected to said second potential line, and when said ordinary reading mode is carried out, said non-selective potential is applied to said second potential line, and wherein said pad is connected to said second potential line by interposing said low level potential applying circuit.

5. A non-volatile semiconductor memory device according to claim 4, wherein said low level switching circuit includes:
   the first N channel MOS transistor connected between said pad and said second potential line wherein the gate is connected to a non-selective potential node for supplying said non-selective potential,
   the second N channel MOS transistor connected between said non-selective potential node and said second potential line wherein the gate is connected to said pad, and
   a charging circuit for charging the gate of said second N channel MOS transistor.

6. A non-volatile semiconductor memory device according to claim 2, wherein said row selection circuit includes:
   decoders each decoding said address signal to output a decode signal having an amplitude between said selective potential and said non-selective potential,
   drive signal generating circuits provided corresponding respectively to said word lines, each of which receives a high level potential and is connected to said second potential line and which outputs a drive signal having an amplitude between said high level potential and the potential of said second potential line in response to said decode signal, and
   a plurality of word line drivers each having a gate circuit comprising a P channel type drive transistor which is connected between said first potential line and the word line corresponding thereto and which is turned on when said drive signal have the potential of said second potential line, and an N channel type drive transistor which is connected between said second potential line and the word line corresponding thereto and which is turned on when said drive signal have said high level potential.

7. A non-volatile semiconductor memory device according to claim 2, wherein said row selection circuit includes:

a negative potential generating circuit for generating a negative potential which is lower than said prescribed potential, decoders each decoding said address signal to output a decode signal having an amplitude between said selective potential and said non-selective potential, drive signal generating circuits provided corresponding respectively to said word lines, each of which receives a high level potential and a negative potential to output a drive signal having an amplitude between said high level potential and said negative potential in response to said decode signal, and a plurality of word line drivers each having a gate circuit comprising a P channel type drive transistor which is connected between said first potential line and the word line corresponding thereto and which is turned on when said drive signal have said negative potential, and an N channel type drive transistor which is connected between said second potential line and the word line corresponding thereto and which is turned on when said drive signal have said high level potential.

* * * * *